United States Patent
Deng et al.

(10) Patent No.: US 11,709,153 B2
(45) Date of Patent: Jul. 25, 2023

(54) ACOUSTIC MEASUREMENT OF FABRICATION EQUIPMENT CLEARANCE

(71) Applicant: Taiwan Semiconductor Manufacturing Company, Ltd., Hsin-Chu (TW)

(72) Inventors: Jun-Hao Deng, Hsin-Chu (TW); Kuan-Wen Lin, Taichung (TW); Sheng-Chi Chin, Hsinchu (TW); Yu-Ching Lee, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 227 days.

(21) Appl. No.: 17/102,255

(22) Filed: Nov. 23, 2020

(65) Prior Publication Data
US 2021/0072196 A1    Mar. 11, 2021

Related U.S. Application Data

(60) Continuation of application No. 16/047,828, filed on Jul. 27, 2018, now Pat. No. 10,845,342, which is a
(Continued)

(51) Int. Cl.
*G01N 29/44* (2006.01)
*B08B 13/00* (2006.01)
(Continued)

(52) U.S. Cl.
CPC ............... *G01N 29/44* (2013.01); *B08B 3/04* (2013.01); *B08B 5/02* (2013.01); *B08B 13/00* (2013.01);
(Continued)

(58) Field of Classification Search
CPC ...... G01B 17/00; G01B 17/02; G01B 17/025; G01B 21/16; H01L 21/67253;
(Continued)

(56) References Cited

U.S. PATENT DOCUMENTS 3,220,248 A * 11/1965 Wood ............... G01B 17/02
73/900
3,690,154 A *  9/1972 Wells ............... G01B 17/02
73/616
(Continued)

FOREIGN PATENT DOCUMENTS

CN    103270597    8/2013
EP    2088395    12/2009
(Continued)

*Primary Examiner* — David L Singer
(74) *Attorney, Agent, or Firm* — Haynes and Boone, LLP (57) ABSTRACT

Methods and systems disclosed herein use acoustic energy to determine a gap between a wafer and an integrated circuit (IC) processing system and/or determine a thickness of a material layer of the wafer during IC processing implemented by the IC processing system. An exemplary method includes emitting acoustic energy through a substrate and a material layer disposed thereover. The substrate is positioned within an IC processing system. The method further includes receiving reflected acoustic energy from a surface of the substrate and a surface of the material layer disposed thereover and converting the reflected acoustic energy into electrical signals. The electrical signals indicate a thickness of the material layer.

20 Claims, 8 Drawing Sheets

Related U.S. Application Data division of application No. 14/942,402, filed on Nov. 16, 2015, now Pat. No. 10,794,872.

(51) Int. Cl.
| | | |
|---|---|---|
| *G01B 17/00* | (2006.01) | |
| *G01B 21/16* | (2006.01) | |
| *B08B 3/04* | (2006.01) | |
| *B08B 5/02* | (2006.01) | |
| *H01L 21/02* | (2006.01) | |
| *H01L 21/288* | (2006.01) | |
| *H01L 21/67* | (2006.01) | |
| *H01L 21/66* | (2006.01) | |
| *G01B 17/02* | (2006.01) | |

(52) U.S. Cl.
CPC .......... *G01B 17/00* (2013.01); *G01B 17/02* (2013.01); *G01B 17/025* (2013.01); *G01B 21/16* (2013.01); *H01L 21/02041* (2013.01); *H01L 21/02282* (2013.01); *H01L 21/02623* (2013.01); *H01L 21/288* (2013.01); *H01L 21/67253* (2013.01); *H01L 22/10* (2013.01); *G01N 2291/044* (2013.01)

(58) Field of Classification Search
CPC . H01L 21/67051; H01L 21/683–68792; H01L 21/02282; H01L 21/02057; H01L 21/02623; H01L 21/288; H01L 21/10; H01L 21/68; H01L 21/12; H01L 21/02041; G03F 7/162; G01N 2291/2697; G01N 29/44; G01N 2291/044; Y10S 134/902; B08B 3/024; B08B 5/02; B08B 13/00; B08B 3/04
USPC .................. 438/14, 759, 782; 73/597, 629
See application file for complete search history.

(56) References Cited

U.S. PATENT DOCUMENTS

| | | | |
|---|---|---|---|
| 3,748,895 A * | 7/1973 | Kummer, Jr. ........... G01S 15/18 73/901 |
| 4,334,433 A * | 6/1982 | Takahashi ............... G01N 29/40 73/629 |
| 4,523,122 A * | 6/1985 | Tone ....................... G10K 11/02 73/644 |
| 4,539,847 A * | 9/1985 | Paap ..................... G01B 17/025 73/579 |
| 5,240,552 A * | 8/1993 | Yu .......................... B24B 37/04 438/959 |
| 5,271,274 A | 12/1993 | Khuri-Yakub et al. |
| 5,974,886 A * | 11/1999 | Carroll ................. G01B 17/025 73/598 |
| 6,051,349 A * | 4/2000 | Yoshioka .................. G03F 7/16 118/232 |
| 6,355,156 B1 * | 3/2002 | Li ............................ B23H 3/02 205/652 |
| 6,524,774 B1 * | 2/2003 | Sonderman ............ G03F 7/162 438/758 |
| 6,548,115 B1 * | 4/2003 | Gibson ................... B05C 21/00 118/301 |
| 6,638,366 B2 * | 10/2003 | Lammert .......... H01L 21/67051 134/32 |
| 6,951,042 B1 * | 10/2005 | Mikhaylichenko ....... B08B 1/04 15/21.1 |
| 8,216,767 B2 | 7/2012 | Wang et al. |
| 8,323,870 B2 | 12/2012 | Lee et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,741,551 B2 | 6/2014 | Wu et al. |
| 2002/0037462 A1 * | 3/2002 | Ogata ................... G03F 7/3021 430/311 |
| 2002/0106848 A1 * | 8/2002 | Wack ................. G03F 7/70658 438/200 |
| 2002/0180961 A1 * | 12/2002 | Wack .................. G01N 21/9501 356/600 |
| 2002/0180986 A1 * | 12/2002 | Nikoonahad ........ G01N 21/211 356/600 |
| 2002/0182760 A1 * | 12/2002 | Wack ................. G03F 7/70616 356/600 |
| 2003/0049376 A1 * | 3/2003 | Schwarm ............... G05B 19/00 427/255.28 |
| 2004/0113523 A1 * | 6/2004 | Hashimoto ............. G10K 11/02 310/326 |
| 2004/0235205 A1 * | 11/2004 | Levy ................... G01N 21/9501 257/E21.53 |
| 2004/0259328 A1 * | 12/2004 | Ito ..................... H01L 21/31654 257/E21.309 |
| 2005/0172894 A1 * | 8/2005 | Farnworth ........ H01L 21/67253 118/712 |
| 2005/0228491 A1 * | 10/2005 | Snyder ...................... A61F 2/06 623/1.46 |
| 2005/0257617 A1 * | 11/2005 | Busch ............... H01L 21/67288 73/584 |
| 2010/0013626 A1 * | 1/2010 | Park ................... H01L 21/67259 118/712 |
| 2010/0039128 A1 * | 2/2010 | Nitsch ..................... H01L 22/12 324/762.05 |
| 2010/0147336 A1 | 6/2010 | Obweger et al. |
| 2012/0056245 A1 | 3/2012 | Kang et al. |
| 2012/0186348 A1 * | 7/2012 | Matsumoto .......... G01B 17/025 73/597 |
| 2013/0036815 A1 * | 2/2013 | Bernhardsgruetter .. A47J 31/52 137/551 |
| 2013/0228015 A1 * | 9/2013 | Wimplinger ............. G01B 7/06 73/632 |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065782 A1 | 3/2014 | Lu et al. |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |
| 2015/0060945 A1 | 3/2015 | Murphy et al. |
| 2015/0279662 A1 * | 10/2015 | Zhang ................. H01L 21/6715 427/58 |
| 2015/0303078 A1 * | 10/2015 | Ishibashi ........... H01L 21/67034 134/18 |

FOREIGN PATENT DOCUMENTS

| | | | |
|---|---|---|---|
| JP | H08271242 | 10/1996 | |
| JP | 2000310522 | 11/2000 | |
| KR | 20050116889 | 12/2005 | |
| KR | 100579375 | 5/2006 | |
| KR | 20080107381 | 12/2008 | |
| TW | 200834687 A * | 8/2008 | ....... H01L 21/02052 |

* cited by examiner

ACOUSTIC MEASUREMENT OF FABRICATION EQUIPMENT CLEARANCE

This is a continuation application of U.S. patent application Ser. No. 16/047,828, filed Jul. 27, 2018, now U.S. Pat. No. 10,845,342, which is a divisional application of U.S. patent application Ser. No. 14/942,402, filed Nov. 16, 2015, now U.S. Pat. No. 10,794,872, both of which are incorporated herein by reference in their entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

As merely one example, many fabrication steps involve some portion of a fabrication tool coming into close proximity with a mask substrate, a semiconductor substrate, or other workpiece. However, contact with the workpiece can be catastrophic. To further complicate matters, improvements in fabrication processes may intentionally or inadvertently entail moving a projecting part of the tool closer to the workpiece. For example, a fluid nozzle may be moved closer to a workpiece to better control where the fluid is applied and to reduce bubbles, vortices, or other fluid disruptions.

Even when the process is unchanged, the move towards larger semiconductor substrates and mask substrates may pose challenges. In that regard, 300 mm wafers have become common because they allow more circuits to be fabricated concurrently, and larger wafers are projected in the future. Likewise, mask sizes are increasing to enhance feature quality. However, these larger workpieces may warp easier than their smaller counterparts, may be less uniform, and may have more surface irregularities. Any of these factors may increase the risk of inadvertent contact with a fabrication tool. Larger workpieces may also be more fragile making contact more dangerous.

Accordingly, while conventional techniques for measuring and controlling clearance between a fabrication tool and a workpiece have been generally adequate, the potential for future improvements still exists. Tools with more precise control over the distance between the tool and the workpiece may reduce the occurrence and severity of contact events. Furthermore, once in place, these controls may be utilized to measure and control other aspects of the fabrication process. For these reasons and others, additional improvements to measurement and tool control may provide significant improvements throughout the fabrication process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to IC device manufacturing and, more particularly, to an improved technique for controlling the clearance between a portion of a fabrication tool and a workpiece.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
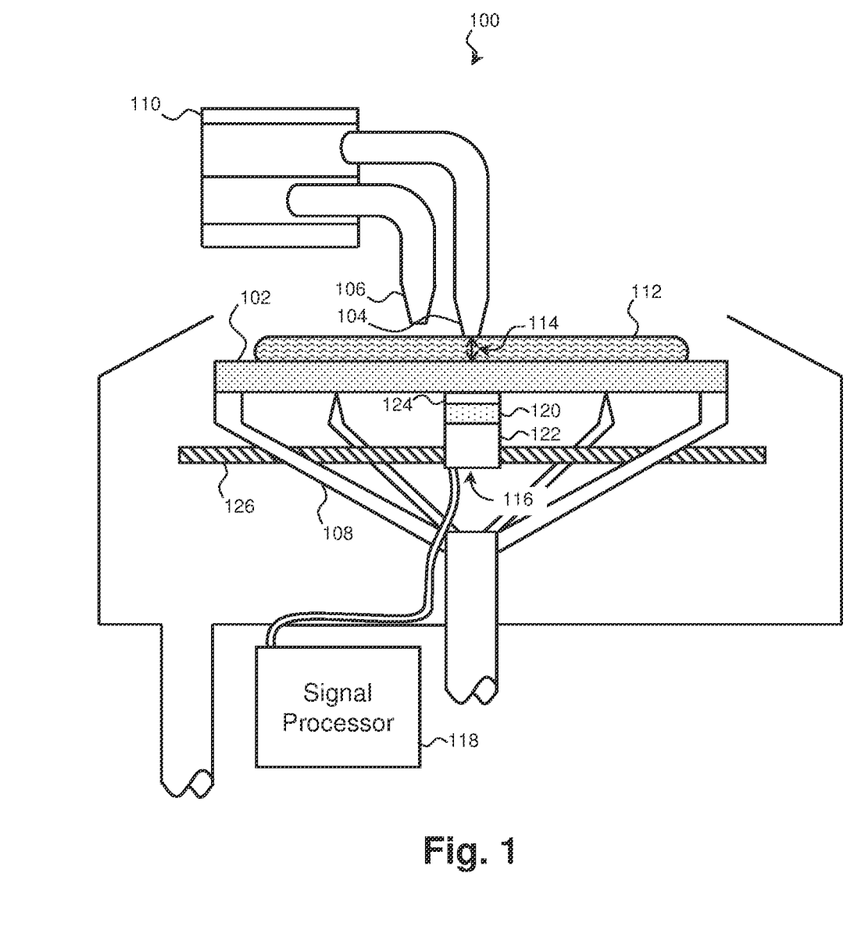
FIG. 1 is a cross-sectional view of a cleaning apparatus according to various aspects of the present disclosure.

The present disclosure relates to the fabrication of a semiconductor integrated circuit. An exemplary tool that may be used in the fabrication of a semiconductor integrated circuit is described with reference to FIG. 1. In that regard, FIG. 1 is a cross-sectional view of a cleaning apparatus 100 according to various aspects of the present disclosure. For clarity and ease of explanation, some elements of the figure have been simplified, and some elements of the figure have been exaggerated.

The cleaning apparatus 100 cleans a retained substrate 102 by directing a liquid and/or gas at the substrate 102 in order to remove particles and other contaminants. The cleaning apparatus 100 has a portion that comes into close proximity with the substrate 102 during the cleaning process. For example, the portion may include one or more nozzles (e.g., liquid nozzle 104 and gas nozzle 106). In many embodiments, the clearance or distance between the nozzles 104 and 106 and the substrate 102 is carefully controlled so that the nozzles do not come into contact with the substrate 102. In contrast to many conventional techniques, the cleaning apparatus 100 uses an acoustic measurement to control the clearance as described in more detail below. This technique may be performed in real time while the cleaning process is underway without contacting any nozzle or the surface of the substrate 102 being cleaned.

The elements of the cleaning apparatus 100 will now be described in more detail. The cleaning apparatus 100 receives a substrate 102 that is exemplary of any workpiece to be operated on by the cleaning apparatus 100. For example, substrate 102 may represent a photolithographic mask for circuit fabrication, a semiconductor substrate, and/or any other suitable substrate for any other suitable application. In various examples, a mask substrate 102 comprises soda-lime glass, fused silica, fused quartz, and/or calcium fluoride ($CaF_2$) with a light-absorptive material such as chromium disposed thereupon. A reflective mask substrate 102 may also include a multi-layer reflective structure. In further examples, a semiconductor substrate 102 includes an elementary (single element) semiconductor, such as germanium in a crystalline structure; a compound semiconductor, such as silicon germanium, silicon carbide, gallium arsenic, gallium phosphide, indium phosphide, indium arsenide, and/or indium antimonide; a non-semiconductor material; and/or combinations thereof. The substrate 102 may also include various material layers formed upon it. The cleaning apparatus 100 may include a chuck 108 operable to retain the substrate 102. The chuck 108 may use any mechanism to retain the substrate 102, such as physical clamping, vacuum retention, electrostatic attraction, and/or other retaining mechanism.

The cleaning apparatus 100 may include one or more nozzles (e.g., nozzles 104 and 106) and associated supply lines mounted on a movable armature 110. The movable armature 110 may relocate the nozzles to a "home" position out of the loading path when a new substrate 102 is being secured and may move the nozzles over the substrate 102 once the substrate 102 has been loaded. In some embodiments, the moveable armature 110 also allows the nozzles 104 and 106 to be positioned anywhere along the substrate 102 during the cleaning process. The nozzles may include liquid supply nozzles 104 operable to direct a liquid material 112 towards the substrate 102 and/or gas delivery nozzles 106 operable to direct a gas toward the substrate 102. Suitable liquid supply nozzles 104 for applying a liquid material 112 include Honda mega-sonic puddle nozzles, as well as mega-sonic nozzles in general, jet-spray nozzles, immersion lithography nozzles, etc. In the context of the cleaning apparatus 100, the liquid material 112 may include any suitable cleaning solution, such as IPA (isopropyl alcohol), acetone, water, other solvents, and/or combinations thereof depending in part on the substrate 102 material, the nature of the contaminants being removed, and/or other factors. Of course, liquid material 112 represents any fluid applied to a substrate 102. In various embodiments, the liquid supply nozzles 104 supply a liquid material 112 that contains reactants, protectants, etchants, spin-coated materials, and/or other suitable materials during the course of the technique described herein.

Similar to the liquid supply nozzles 104, the cleaning apparatus 100 may include one or more gas delivery nozzles 106 on the armature 110 and aimed to direct air towards the substrate 102 surface. The gas delivery nozzles 106 may blow ambient air; inert gasses such as nitrogen, argon, and/or helium; process gasses; or any other suitable gasses on the substrate 102. While the gasses are being supplied, the movable armature 110 may sweep the gas delivery nozzles 106 across the surface of the substrate 102 in order to drive off the liquid material 112, particles, and/or contaminants. In a cleaning context, the gasses provided by the gas delivery nozzles 106 may be heated in order to control the viscosity and/or evaporation of the liquid material 112 on the substrate 102.

While contact-based methods may be used to measure a gap 114 between the nozzles and the substrate 102 when the cleaning apparatus 100 is not in operation, the liquid material 112 or gas may prevent such techniques while the apparatus 100 is cleaning. For example, a common technique includes inserting a feeler gauge in the gap 114, which may not be possible during operation. In fact, even when the cleaning apparatus 100 is not in operation, damage to the substrate 102 is a possibility if a feeler gauge is used while the substrate 102 is present. Moreover, in many embodiments, offline measurements have limited usefulness. The force of the liquid material 112 or gas may drive the nozzles and the substrate 102 apart, changing the gap 114 distance.

To overcome these challenges and others, the cleaning apparatus 100 is operable to perform an acoustic gap measurement between the nozzles and the substrate 102. To this end, the cleaning apparatus 100 includes a transducer 116, such as a piezoelectric ultrasonic transducer, coupled to the substrate 102. The transducer 116 emits acoustic energy that travels outward through the coupled substrate 102. At each material interface, some portion of the acoustic energy is reflected as an echo. These echoes may be received by the transducer 116 and converted into an electrical signal. By examining the electrical signal, a signal processing resource 118 of the cleaning apparatus 100 can identify the echoes produced by a topmost surface of the substrate 102 and echoes produced by a bottommost surface of the nozzles 104 and/or 106. By analyzing the echoes, the signal processing resource 118 determines the gap 114 distance between these surfaces.

The transducer 116 may include any suitable acoustic transmitter and/or receiver and may have any suitable center frequency. For example, in various embodiments, the transducer 116 includes an ultrasonic transducer having a center frequency between about 5 MHz and about 40 MHz (+/− 10%).

The transducer 116 may include a transducer layer 120 containing one or more piezoelectric material layers, capacitive material layers, or other suitable material layers. To prevent phase cancelation of the signal at the transducer layer 120 boundaries, the transducer layer 120 may be configured to have a thickness (perpendicular to the substrate 102) that is an integer multiple of λ/2, where λ is a wavelength corresponding with a desired center frequency of the transducer 116. The transducer 116 may also include a backing material 122 disposed on a back surface of the transducer layer 120 opposite the substrate 102. Because the transducer layer 120 may emit energy directed away from the substrate 102, the backing material 122 may be configured to dampen this energy or to reflect it back towards the substrate 102. A damping backing material 122 may be selected to have an acoustic impedance similar to that of the transducer layer 120, whereas a reflective backing material 122 may be selected to have an acoustic impedance different from that of the transducer layer 120.

The transducer 116 may also include an acoustic impedance matching layer 124 disposed between and contacting the transducer layer 120 and the substrate 102. Because an abrupt change in acoustic impedance between the transducer layer 120 and the substrate 102 may reflect acoustic energy and create echoes, the acoustic impedance matching layer 124 may be utilized to smooth the acoustic transition. This may improve the sensitivity of the transducer 116 and reduce noise caused by the unintended echoes. Accordingly, the acoustic impedance matching layer 124 may have an acoustic impedance that is between that of the transducer layer 120 and the substrate 102. In an embodiment, the acoustic impedance matching layer 124 has an acoustic impedance that is substantially equal to: $\sqrt{Z_{Transducer} * Z_{Substrate}}$ (+/− 10%), where $Z_{Transducer}$ is the acoustic impedance of the transducer layer 120 and $Z_{Substrate}$ is the acoustic impedance of the substrate 102. To prevent phase cancelation, the acoustic impedance matching layer 124 may be configured to have a thickness (perpendicular to the substrate 102) that is an integer multiple of λ/4, where λ is a wavelength corresponding with a desired center frequency of the transducer 116. Suitable materials for the acoustic impedance matching layer 124 include polymers, ceramics, glasses, metals, composite materials, and/or other suitable materials. The increased sensitivity provided by the acoustic impedance matching layer 124 may be particularly beneficial when the gap 114 being measured is at least partially filled with a gas (rather than a liquid) because gasses tend not to conduct acoustic energy as well and produce fainter echoes.

In some embodiments, the transducer 116 is coupled to an armature 126 and is operable to move along the backside of the substrate 102. The armature 126 may be used to align the transducer 116 with the nozzle being measured and to track the nozzle as it moves along the substrate 102.

Figure 2:
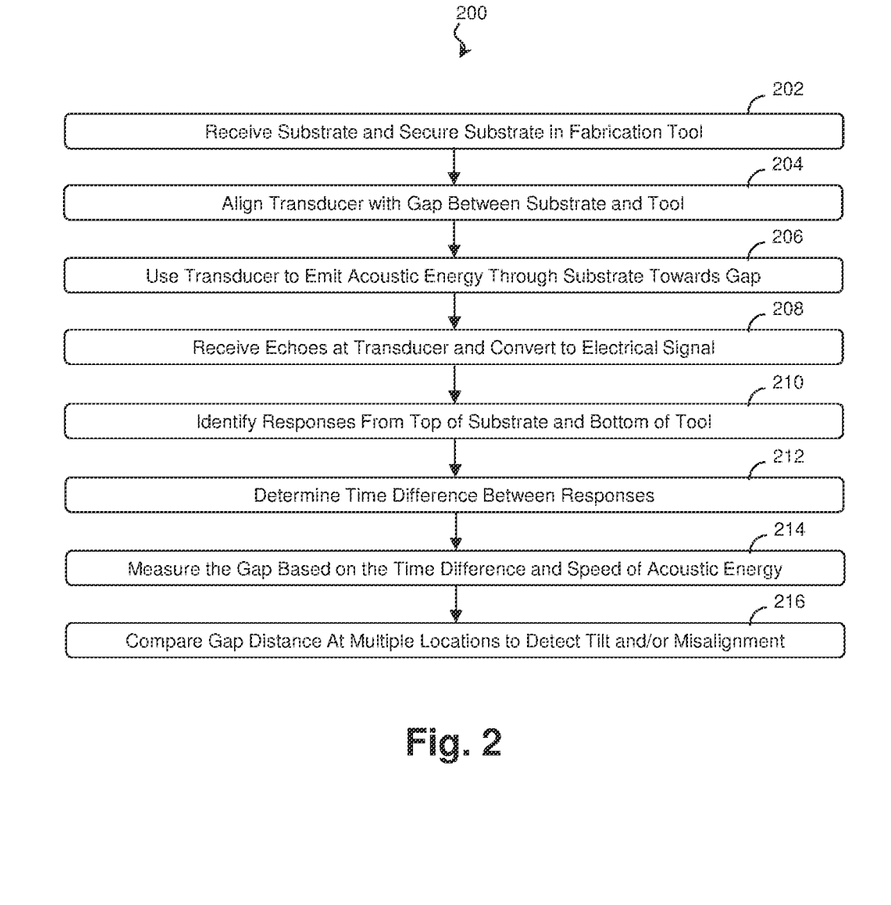
FIG. 2 is a flow diagram of a method of gap measurement according to various aspects of the present disclosure.
Figure 6:
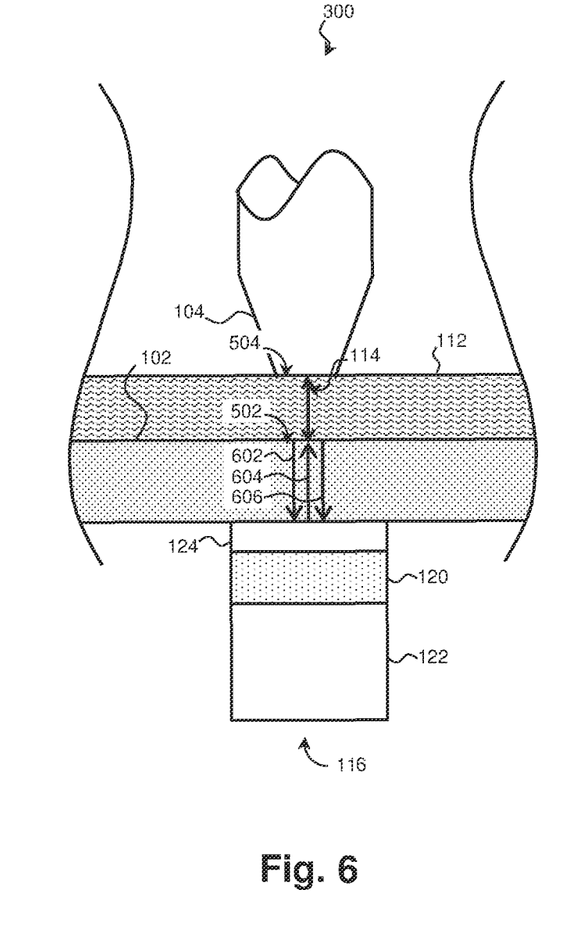
FIG. 6 is a further cross-sectional view of the fabrication tool performing the method of gap measurement according to various aspects of the present disclosure.
Figure 7:
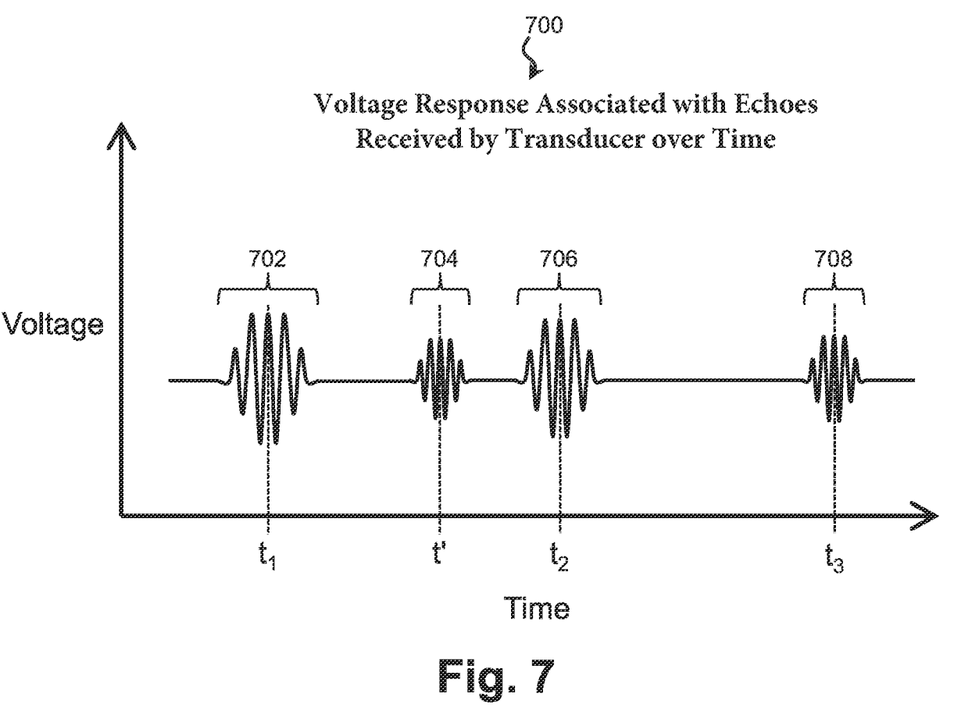
FIG. 7 is a plot of a voltage response of a transducer over time according to various aspect of the present disclosure.

The acoustic measurement performed by the cleaning apparatus 100 or other suitable fabrication tool is described with reference to FIGS. 2-7. FIG. 2 is a flow diagram of a method 200 of gap measurement according to various aspects of the present disclosure. It is understood that additional steps can be provided before, during, and after the method 200 and that some of the steps described can be replaced or eliminated for other embodiments of the method 200. FIGS. 3-6 are cross-sectional views of a fabrication tool 300 performing the method of gap measurement according to various aspects of the present disclosure. In some examples, the fabrication tool 300 is the cleaning apparatus 100 of FIG. 1, although other suitable fabrication tools 300 are provided and described below. The fabrication tool 300 includes a transducer 116 (with optional impedance matching layer 124) substantially similar to that of FIG. 1. FIG. 7 is a plot 700 illustrating a voltage response associated with echoes received by the transducer over time according to various aspect of the present disclosure. For clarity and ease of explanation, some elements of the figures have been simplified, and some elements of the figures have been exaggerated.

Figure 3:
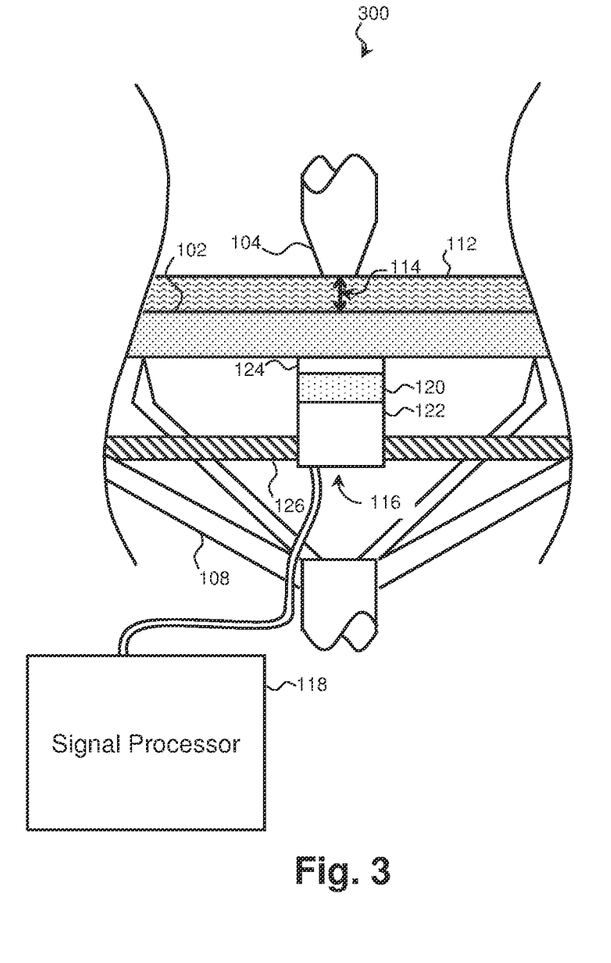
FIG. 3 is a cross-sectional view of a fabrication tool performing the method of gap measurement according to various aspects of the present disclosure.

Referring to block 202 of FIG. 2 and to FIG. 3, a substrate 102 is received and secured in the fabrication tool 300. As described above, the substrate 102 is exemplary of any workpiece to be operated on by the fabrication tool 300 and may represent a photolithographic mask for circuit fabrication, a semiconductor substrate, and/or any other suitable substrate for any other suitable application. The fabrication tool 300 has a portion that comes into close proximity with the substrate 102. In the example of FIG. 3, the portion is a liquid supply nozzle 104. The fabrication tool 300 initiates a processing technique utilizing the substrate, such as cleaning using a liquid material 112. At any time during the processing technique, the acoustic transducer 116 may be used to measure a gap 114 between the substrate 102 and the fabrication tool 300.

Referring to block 204 of FIG. 2, an armature 126 is used to move the acoustic transducer 116 along a backside surface of the substrate 102. The armature 126 may align the transducer 116 so that it is directly underneath the gap 114 being measured. In the illustrated embodiment, the armature 126 tracks the liquid supply nozzle 104 so that the transducer 116 remains directly underneath the liquid supply nozzle 104 and thus directly underneath the gap 114.

Figure 4:
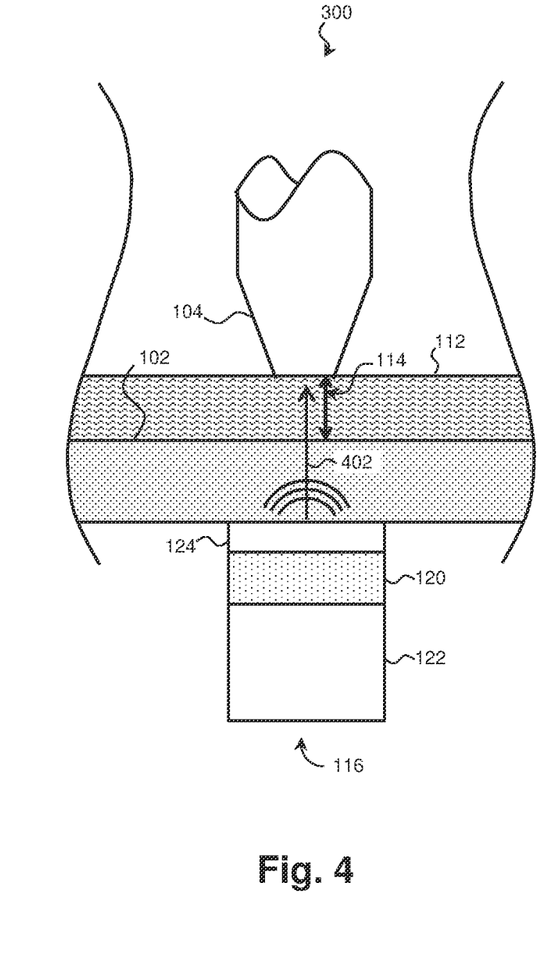
FIG. 4 is a further cross-sectional view of the fabrication tool performing the method of gap measurement according to various aspects of the present disclosure.

Referring to block 206 of FIG. 2 and to FIG. 4, the transducer 116 emits acoustic energy in the form of a longitudinal wave or other suitable waveform that is conducted from the transducer 116 through the substrate 102 as shown by arrow 402. One of the advantages of measurement using a transducer 116 is that is it may be performed while the fabrication tool 300 is operating. For example, the transducer 116 may emit an acoustic impulse while a liquid material 112 (e.g., a cleaning fluid) is being supplied by the liquid supply nozzle 104. The flow of the liquid material 112 does not significantly affect the acoustic energy. In a further example, the transducer 116 may be aligned with a gas supply nozzle of the fabrication tool 300 and may emit an acoustic impulse while a gas is being supplied by the gas supply nozzle.

Figure 5:
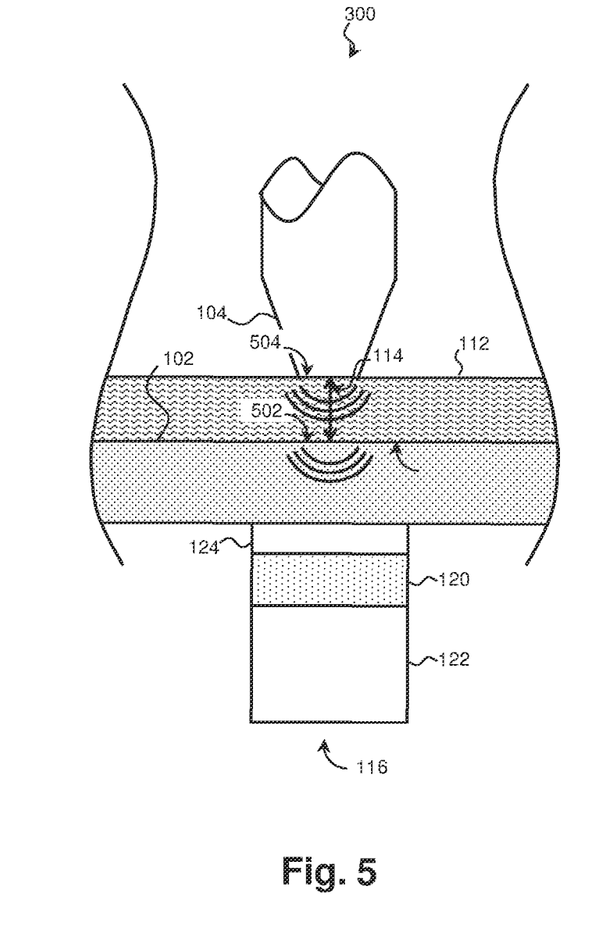
FIG. 5 is a further cross-sectional view of the fabrication tool performing the method of gap measurement according to various aspects of the present disclosure.

Referring to FIG. 5, acoustic energy is reflected at each material interface including at an interface at a topmost surface 502 of the substrate 102 surface and at an interface at a bottommost surface 504 of the fabrication tool 300 on opposite sides of the gap 114. FIG. 6 shows a second-order echo caused by energy reflected by the topmost surface 502 of the substrate 102 (as indicated by arrow 602), then reflected by a back surface of the substrate 102 (as indicated by arrow 604), then reflected again by the topmost surface 502 of the substrate 102 (as indicated by arrow 606). Depending on the medium in the gap 114, second-order echoes from the bottommost surface 504 of the tool 300 may be too attenuated to distinguish. Second-order (and above) echoes may be compensated for as explained below.

Referring to block 208 of FIG. 2 and to FIG. 7, the echoes are received by the transducer 116 and converted to an electrical signal, an example of which is shown in FIG. 7. In that regard, FIG. 7 is a plot of voltage over time, and as can be seen, the echoes produce characteristic voltage responses (e.g., response 702, 704, 706, and 708) at different times depending on the distance between the transducer 116 and the surface producing the echo. In the example of FIG. 7, responses 702, 706, and 708 represent the first, second, and third order echoes produced by the topmost surface 502 of the substrate 102, and response 704 represents the first order echo produced by the bottommost surface 504 of the tool 300. This electrical signal is provided to the signal processor 118 shown in FIG. 3.

Referring to block 210 of FIG. 2, the signal processor 118 identifies the first order echo responses from the surfaces on either side of the gap 114. In the example of FIGS. 3-7, these are response 702 of the first order echo from the topmost surface 502 of the substrate 102 and response 704 of the first order echo from the bottommost surface 504 of the tool 300. It will be recognized that the time that a response is captured is directly proportional to the distance the acoustic signal has traveled. This means that the time that response 702 is received depends on how far the topmost surface 502 of the substrate 102 is from the transducer 116. Likewise, the time that response 704 is received depends on how far the bottommost surface 504 of the tool 300 is from the transducer 116.

Referring to block 212 of FIG. 2, the signal processor 118 determines the difference in time between the first-order response 702 from the topmost surface 502 of the substrate 102 and the first-order response 704 from the bottommost surface 504 of the tool 300. The difference in time is due to the acoustic signal traversing the gap 114. Accordingly, referring to block 214, of FIG. 2, the signal processor 118 measures the gap 114 by multiplying the difference in time by the velocity of the acoustic signal in whatever materials are found in the gap 114 (e.g., liquid material 112) and dividing by 2 since the signal traverses the gap twice, one on the outbound path and once on the return path, to reach the transducer 116. Put another way:

$$D=V^{*}(t'-t_1)/2$$

where D represents the gap 114 distance, V is the velocity of the acoustic signal in the material(s) of the gap 114, t' is the time of the first order response 704 from the bottommost surface 504 of the tool 300 and $t_1$ is the time of the first order response 702 from the topmost surface 502 of the substrate 102.

Once the gap 114 distance is determined, the method of blocks 202-214 may be repeated at different times and/or locations to monitor the gap 114 as fabrication progresses. For in an embodiment, blocks 202-214 are repeated at different points along the gap. Referring to block 216, the signal processor 118 compares the uniformity of the gap distance 114 at multiple locations to determine whether the topmost surface 502 of the substrate 102 and the bottommost surface 504 of the tool 300 are parallel across the gap. This may be used to detect tilt, substrate misalignment, substrate irregularities, and/or other conditions. In this way, the fabrication tool 300 determines the gap 114 distance and may detect other alignment issues without affecting the operation of the tool 300 and without risking contact with the substrate 102.

Figure 8:
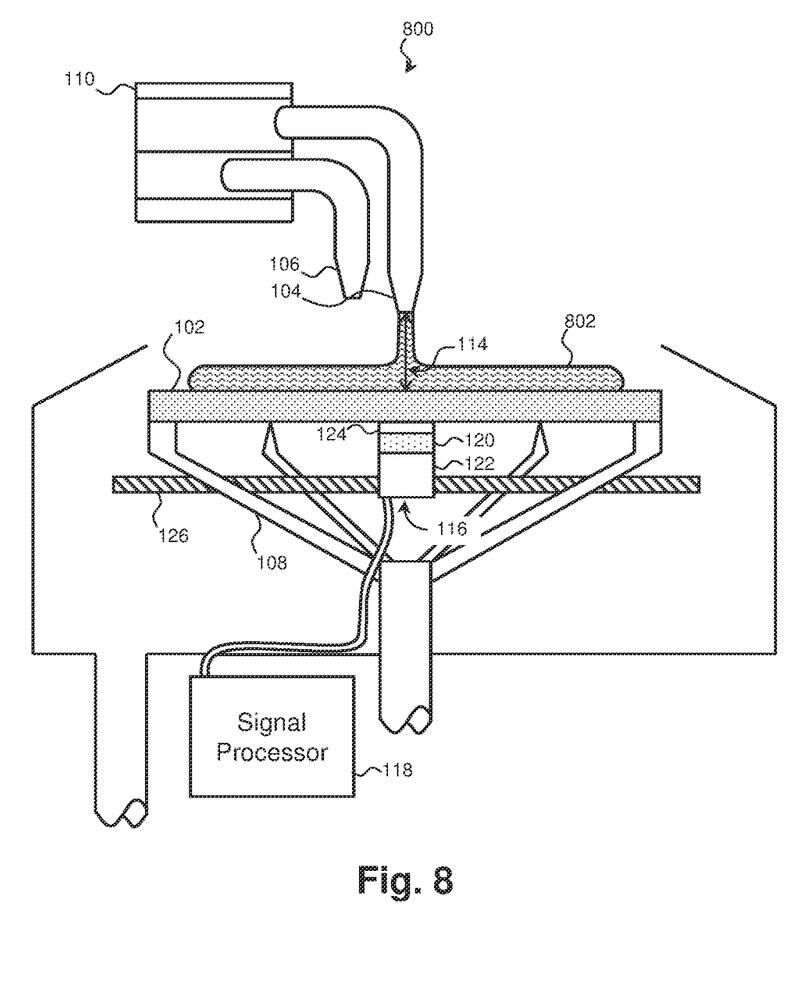
FIG. 8 is a cross-sectional view of a spin-coating system according to various aspects of the present disclosure.
Figure 9:
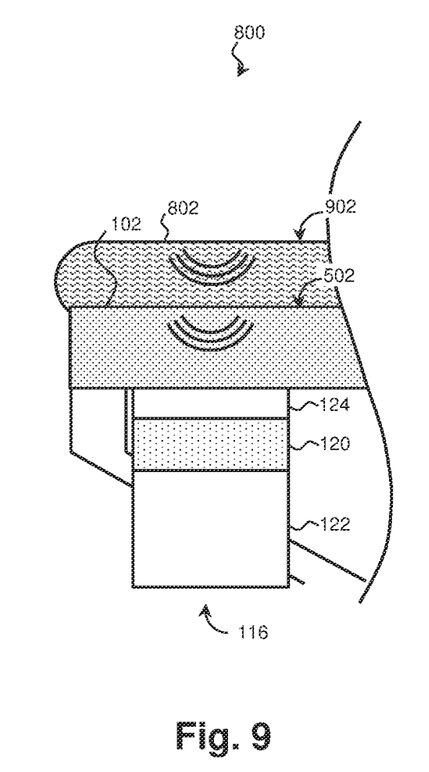
FIG. 9 is a further cross-sectional view of the spin-coating system according to various aspects of the present disclosure.

In some examples, the fabrication tool 300 is a cleaning apparatus 100 as described above. However, another suitable fabrication tool operable to perform the method 200 of FIG. 2 is described with reference to FIGS. 8 and 9. FIGS. 8 and 9 are cross-sectional views of a spin-coating system 800 according to various aspects of the present disclosure. For clarity and ease of explanation, some elements of the figures have been simplified, and some elements of the figures have been exaggerated.

The spin-coating system 800 utilizes the rotation of a substrate 102 to distribute a liquid across the surface. A spin-coating material 802 in liquid form may be deposited at the center of the substrate 102, and the substrate 102 is spun to drive the liquid to the edges. In this way, spin coating leverages the centrifugal tendencies of the liquid to produce a film of significantly uniform thickness. This technique is suitable for applying a wide variety of films upon the substrate 102, with examples including photoresist films, multi-layer photoresist (e.g., trilayer resist) films, antireflective coating films (e.g., a bottom antireflective coating (BARC) film), hard mask films, and/or other suitable films. Accordingly, the system 800 may include a rotating chuck 108 operable to retain and rotate the substrate 102. The chuck 108 may use any method to retain the substrate 102, such as physical clamping, vacuum retention, electrostatic attraction, and/or other retaining mechanism. As with the substrate 102 of FIG. 1, the substrate 102 is exemplary of any workpiece to be operated on by the spin-coating system 800 and may represent a photolithographic mask for circuit fabrication, a semiconductor substrate, and/or any other suitable substrate for any other suitable application.

The spin-coating system 800 may also include an acoustic (e.g., ultrasound) transducer 116 disposed on an armatures 126 substantially as described in FIGS. 1-7. For example, the transducer 116 may include a transducer layer 120, a backing material 122, and an optional impedance matching layer 124 each substantially similar to those of FIGS. 1-7. Likewise, the transducer 116 may be coupled to a signal processor 118 substantially as described with reference to the preceding figures.

Once the substrate 102 is secured, the chuck 108 rotates around a central axis causing the retained substrate 102 to rotate as well. Rotational speeds may reach or exceed 3,000 rpm based on the application. Because of increased turbulence and rotational instability, maximum rotational speeds for larger wafers tend to be slower, and a typical maximum rotational speed for a 300 mm substrate 102 may be between about 800 rpm and about 4,000 rpm. The rotational speed of the chuck 108 (and by extension the substrate 102) may vary throughout the spin coating technique in order to control the dispersal of a spin-coating material 802 being applied.

To supply the liquid, spin-coating system 800 may include one or more liquid supply nozzles 104 and one or more gas delivery nozzles 106 mounted on a movable armature 110. The nozzles 104 and 106 and armature 110 may be substantially similar to those of FIG. 1. The spin-coating system 800 may utilize the acoustic transducer 116 and the signal processor 118 to measure the gap 114 between the nozzles and the substrate 102 during the application of the spin-coating material 802 using the method 200 as described in FIGS. 2-7.

Referring to FIG. 9, the spin-coating system 800 may also utilize the transducer 116 to measure thickness and/or uniformity of the spin-coating material 802 during the spin coating process. For this purpose, it will be recognized that the acoustic energy may be reflected by any interface including the interface between the spin-coating material 802 being applied and the ambient environment regardless of whether the spin-coating material 802 is in liquid, semi-solid, or solid form. Thus, echoes may be generated at the topmost surface 502 of the substrate 102 as well as at a topmost surface 902 of the spin-coating material 802.

Figure 10:
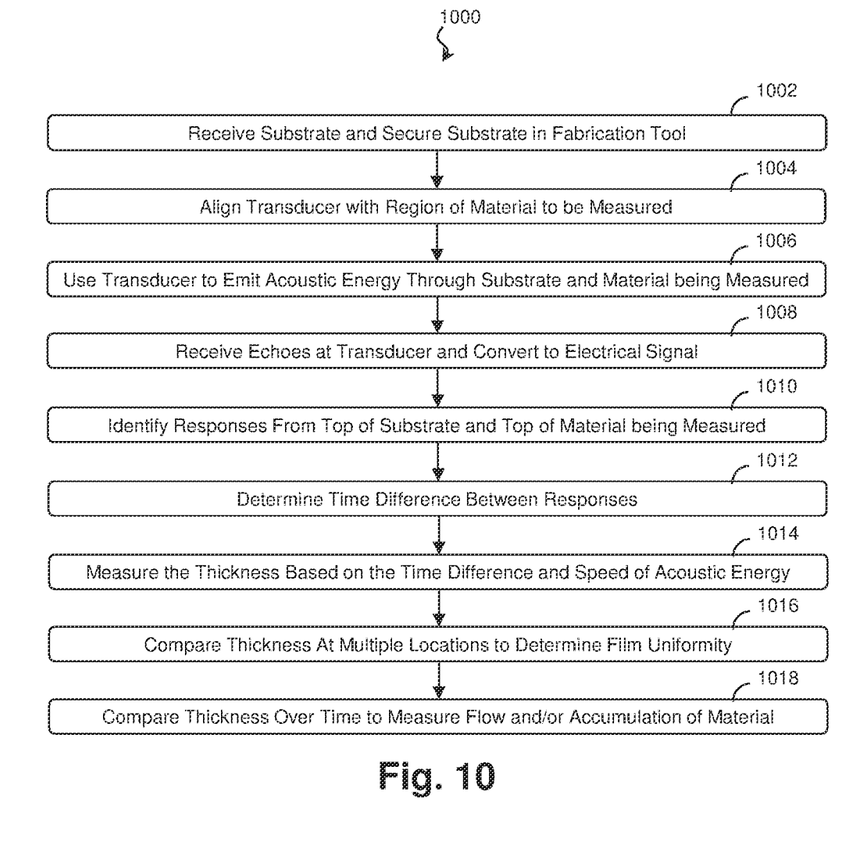
FIG. 10 is a flow diagram of a method of film thickness measurement according to various aspects of the present disclosure.

A method 1000 for measuring film thickness that may be performed by the spin-coating system 800 is described with reference to FIG. 10. In that regard, FIG. 10 is a flow diagram of a method 1000 of film thickness measurement according to various aspects of the present disclosure. It is understood that additional steps can be provided before, during, and after the method 1000 and that some of the steps described can be replaced or eliminated for other embodiments of the method 1000. The method 1000 includes blocks 1002-1014, which may be substantially similar to blocks 202-214 of FIG. 2, respectively.

Referring to block 1002, a substrate 102 is received and secured in the spin-coating system 800. The substrate 102 is exemplary of any workpiece to be operated on by the spin-coating system 800 and may represent a photolithographic mask for circuit fabrication, a semiconductor substrate, and/or any other suitable substrate for any other suitable application. Referring to block 1004, an armature 126 is used to move an acoustic transducer 116 along a backside of the substrate 102. The armature may align the transducer 116 directly underneath any reference point where the thickness of a spin-coating material 802 (or other material) is to be measured. In one example, the armature aligns the transducer at the outer edge of the substrate 102 because this is where a spin-coating material 802 tends to be thinnest.

Referring to block 1006, the transducer 116 emits acoustic energy, such as a longitudinal wave, that is conducted from the transducer 116 through the substrate 102 and through the spin-coating material 802. This may be performed while the spin coating system is operating such as while the substrate 102 is being rotated and/or while the spin-coating material 802 is being applied. The acoustic energy is reflected at each material interface including the interface at the topmost surface 502 of the substrate 102 and at the topmost surface 902 of the spin-coating material 802. Referring to block 1008 of FIG. 2 and to FIG. 7, the resulting echoes are received by the transducer 116 and converted to an electrical signal, which is provided to the signal processor 118.

Referring to block 1010, the signal processor 118 identifies a response from the topmost surface 502 of the substrate 102 and a response from the topmost surface 902 of the spin-coating material 802. Referring to block 1012, the signal processor 118 determines the difference in time between the first-order response from the topmost surface 502 of the substrate 102 and the first-order response from the topmost surface 902 of the spin-coating material 802. Referring to block 1014, the signal processor 118 measures the thickness of the spin-coating material 802 by multiplying the difference in time by the velocity of the acoustic signal in the spin-coating material 802 and dividing by 2 since the signal traverses the gap twice.

In many embodiments, the method of blocks 1002-1014 is repeated throughout the spin-coating process. For example, referring to block 1016, the signal processor 118 may compare the measured thickness of the spin-coating material 802 taken at different locations to determine a uniformity of the spin-coating material 802. Referring to block 1018, the signal processor 118 may compare the measured thickness of the spin-coating material 802 taken at different times to determine a flow or accumulation of the spin-coating material 802 over time. In this way, the spin-coating system 800 can monitor the application of the spin coating film in real time and make adjustments to flow rate, spin rate, applied heat, drying time, and/or other processing parameters.

It will be recognized that the cleaning apparatus 100, the fabrication tool 300, and the spin-coating system 800 are merely examples of systems that may perform method 200 and method 1000. These are non-limiting examples, and other systems operable to perform the methods are both contemplated and provided for. The present embodiments can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can store the program for use by or in connection with the instruction execution system, apparatus, or device. The medium may include non-volatile memory including magnetic storage, solid-state storage, optical storage, cache memory, Random Access Memory (RAM).

Thus, the present disclosure provides a system and a method for measuring clearance between a fabrication tool and a workpiece that may be performed while the fabrication tool is in operation. In some embodiments, the provided method includes receiving a substrate within a tool such that a gap is defined therebetween. A transducer disposed on a bottom surface of the substrate opposite the gap provides an acoustic signal that is conducted through the substrate. The transducer also receives a first echo from a top surface of the substrate that defines the gap and a second echo from a bottom surface of the tool that further defines the gap. A width of the gap is measured based on the first echo and the second echo. In some such embodiments, the bottom surface of the tool is a bottom surface of a nozzle, and the nozzle provides at least one of a liquid or a gas in the gap during the providing of the acoustic signal and during the receiving of the first echo and the second echo.

In further embodiments, the provided method includes receiving a substrate having a material layer disposed thereupon. A transducer is provided that is coupled to the substrate opposite the material layer. The transducer emits an acoustic signal directed through the substrate. In response, the transducer receives a first echo from a bottom interface of the material layer and a second echo from a top interface of the material layer. A thickness of the material layer is determined based on the first echo and the second echo. In some such embodiments, the transducer is coupled to the substrate by an impedance matching layer, and the acoustic signal is transmitted through the impedance matching layer.

In yet further embodiments, the provided system comprises a chuck operable to retain a wafer such that the retained wafer defines a gap between the wafer and the system; a transducer operable to: couple to the retained substrate; emit an acoustic signal through the substrate; receive a first echo from a surface of the wafer that defines the gap; receive a second echo from a surface of the system that further defines the gap; and provide a signal representing the first echo and the second echo; and a signal processor operable to receive the signal and to determine a measurement associated with the gap from the first echo and the second echo. In some such embodiments, the system further comprises an impedance matching layer disposed between the transducer and the substrate. The impedance matching layer may have an impedance between that of the transducer and that of the substrate. In some such embodiments, the system further comprises an armature coupled to the transducer and operable to align the transducer directly underneath the gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

delivering, by a nozzle, a fluid to a substrate;

when a tip of the nozzle from which the fluid is delivered to the substrate is aligned with an acoustic transducer at a first time during the delivering of the fluid to the substrate, measuring a first width of a first gap between the substrate and the tip of the nozzle, wherein the measuring is based on first reflected acoustic energy received by the acoustic transducer from the substrate and the tip of the nozzle, the acoustic transducer is physically separate from the nozzle, and the first time corresponds with the tip of the nozzle delivering the fluid to a first location of the substrate;

when the tip of the nozzle from which the fluid is delivered to the substrate is aligned with the acoustic transducer at a second time during the delivering of the fluid to the substrate, measuring a second width of a second gap between the substrate and the tip of the nozzle, wherein the measuring is based on second reflected acoustic energy received by the acoustic transducer from the substrate and the tip of the nozzle and the second time corresponds with the tip of the nozzle delivering the fluid to a second location of the substrate; and determining whether to adjust an alignment between the substrate and the tip of the nozzle based on the first width of the first gap at the first time and the second width of the second gap at the second time, wherein the alignment prevents physical contact between the nozzle and the substrate.

2. The method of claim 1, wherein the determining whether to adjust the alignment between the substrate and the tip of the nozzle based on the first width of the first gap and the second width of the second gap includes detecting substrate surface irregularities, substrate misalignment, substrate tilt, or combinations thereof and the method further includes adjusting the substrate, the nozzle, or both to prevent physical contact between the nozzle and the substrate.

3. The method of claim 1, wherein the first time corresponds with a first rotation of the substrate and the second time corresponds with a second rotation of the substrate.

4. The method of claim 1, further comprising moving the acoustic transducer to align the tip of the nozzle and the acoustic transducer.

5. The method of claim 1, wherein the substrate is positioned between the nozzle and the acoustic transducer, such that the nozzle is positioned along and delivers the fluid to a first surface of the substrate and the acoustic transducer is positioned along a second surface of the substrate, wherein the second surface of the substrate is opposite the first surface of the substrate.

6. The method of claim 1, wherein:

the substrate is retained and rotated within a process chamber by a rotating chuck;

the acoustic transducer includes a transducer layer, a damping backing material layer, and an acoustic impedance matching layer, wherein the damping backing material layer is disposed between the transducer layer and the acoustic impedance matching layer; and the rotating chuck is not disposed between the acoustic impedance matching layer of the acoustic transducer and the substrate.

7. The method of claim 1, wherein the fluid is gas and the first gap and the second gap are filled with the gas at the first time and the second time, respectively.

8. The method of claim 1, wherein the substrate is a reflective mask and the fluid is a cleaning solution for cleaning a surface of the reflective mask.

9. A method comprising:

delivering, by a nozzle, a cleaning fluid to a mask substrate, wherein a force of the cleaning fluid when delivered to the mask substrate affects an alignment between the mask substrate and a tip of the nozzle;

during the delivering of the cleaning fluid to the mask substrate, when the tip of the nozzle from which the cleaning fluid is delivered to the mask substrate is aligned with a piezoelectric ultrasonic transducer at a first time, measuring a first width of a first gap between the mask substrate and the tip of the nozzle, wherein the measuring is based on first reflected acoustic energy received by the piezoelectric ultrasonic transducer from the mask substrate and the tip of the nozzle, the piezoelectric ultrasonic transducer is physically separate from the nozzle, and the first time corresponds with the tip of the nozzle delivering the cleaning fluid to a first location of the mask substrate;

during the delivering of the cleaning fluid to the mask substrate, when the tip of the nozzle from which the cleaning fluid is delivered to the mask substrate is aligned with the piezoelectric ultrasonic transducer at a second time during the delivering of the cleaning fluid to the mask substrate, measuring a second width of a second gap between the mask substrate and the tip of the nozzle, wherein the measuring is based on second reflected acoustic energy received by the piezoelectric ultrasonic transducer from the mask substrate and the tip of the nozzle and the second time corresponds with the tip of the nozzle delivering the cleaning fluid to a second location of the mask substrate; and adjusting the alignment between the mask substrate and the tip of the nozzle based on the first width of the first gap at the first time and the second width of the second gap at the second time, wherein the alignment is adjusted to maintain physical separation of the nozzle and the mask substrate.

10. The method of claim 9, wherein the first reflected acoustic energy and the second reflected acoustic energy each include acoustic energy reflected from more than one material interface.

11. The method of claim 9, wherein the first time corresponds with a first rotation of the mask substrate and the second time corresponds with a second rotation of the mask substrate.

12. The method of claim 9, further comprising heating the cleaning fluid to control a viscosity and evaporation of the cleaning fluid.

13. The method of claim 9, wherein the mask substrate has a topside surface and a backside surface, the nozzle delivers the cleaning fluid to the topside surface of the mask substrate, and the piezoelectric ultrasonic transducer is disposed along the backside surface of the mask substrate.

14. The method of claim 13, wherein a chuck retains and rotates the mask substrate within a process chamber during the delivering of the cleaning fluid and the chuck is not disposed between the piezoelectric ultrasonic transducer and the backside surface of the mask substrate.

15. A method comprising:
  delivering, by a nozzle, a fluid to a substrate;
  when a tip of the nozzle from which the fluid is delivered to the substrate is aligned with an acoustic transducer at a first time during the delivering of the fluid to the substrate, measuring a first width of a first gap between the substrate and the tip of the nozzle, wherein the measuring is based on first reflected acoustic energy received by the acoustic transducer from the substrate and the tip of the nozzle and the acoustic transducer is physically separate from the nozzle;
  when the tip of the nozzle from which the fluid is delivered to the substrate is aligned with the acoustic transducer at a second time during the delivering of the fluid to the substrate, measuring a second width of a second gap between the substrate and the tip of the nozzle, wherein the measuring is based on second reflected acoustic energy received by the acoustic transducer from the substrate and the tip of the nozzle;
  determining whether to adjust an alignment between the substrate and the tip of the nozzle based on the first width of the first gap at the first time and the second width of the second gap at the second time, wherein the alignment prevents physical contact between the nozzle and the substrate; and
  wherein:
    the acoustic transducer includes a transducer layer, a damping backing material layer, and an acoustic impedance matching layer, wherein the damping backing material layer is disposed between the transducer layer and the acoustic impedance matching layer, and
    the substrate is retained and rotated within a process chamber by a rotating chuck, wherein the rotating chuck is not disposed between the acoustic impedance matching layer of the acoustic transducer and the substrate.

16. The method of claim 15, wherein the first time corresponds with the tip of the nozzle delivering the fluid to a first location of the substrate and the second time corresponds with the tip of the nozzle delivering the fluid to a second location of the substrate.

17. The method of claim 15, wherein the first time corresponds with a first rotation of the substrate, the second time corresponds with a second rotation of the substrate, and the first time and the second time correspond with the tip of the nozzle delivering the fluid to the same location.

18. The method of claim 15, further comprising moving the acoustic transducer to align the tip of the nozzle and the acoustic transducer.

19. The method of claim 15, wherein the fluid is a gas.

20. The method of claim 15, wherein the fluid is a liquid.

* * * * *